(12) United States Patent
Chen et al.

(10) Patent No.: US 6,240,115 B1
(45) Date of Patent: May 29, 2001

(54) EPITAXIAL FACET FORMATION FOR LASER DIODES BASED ON III-V MATERIAL SYSTEMS

(75) Inventors: Yong Chen, Mountain View; Shih-Yuan Wang, Palo Alto, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/140,976

(22) Filed: Aug. 27, 1998

(51) Int. Cl.$^7$ .................................................. H01S 5/00
(52) U.S. Cl. ................................. 372/45; 372/46
(58) Field of Search ................. 372/45, 46, 49; 257/94

(56) References Cited

U.S. PATENT DOCUMENTS 5,880,485    3/1999   Marx et al. ............................. 257/94

FOREIGN PATENT DOCUMENTS

| 0 551 721 | 7/1993 | (EP) | ............................ H01L/29/20 |
| 0 874 405 | 10/1998 | (EP) | ............................ H01L/33/00 |

OTHER PUBLICATIONS

Ando, Seigo et al., "Novel Hexagonal–Facet GaAs/AlGaAs Laser Grown by Selective Area Metalorganic Chemical Vapor Deposition", Japanese Journal of Applied Physics, vol. 32, Sep. 15, 1993, No. 9b, Part 2, Tokyo, Japan, pp. 1293–1296.

Ando, Seigo et al., "Selective Area Metalorganic Chemical Vapor Deposition Growth for Hexagonal–Facet Lasers", Journal of Crystal Growth, vol. 145, Dec. 11, 1994, Nos. 1/4, Amsterdam, NL, pp. 302–307.

Kato, Yoshiki et al., "Selective Growth of Wurtzite GaN and $Al_xGa_{1-x}N$ on GaN/Sapphire Substrates by Metalorganic Vapor Phase Epitaxy", Journal of Crystal Growth, Dec. 11, 1994, Nos. 3/4, Amsterdam, NL, pp. 133–140.

*Primary Examiner*—Teresa M. Arroyo
*Assistant Examiner*—Quyen P. Leung

(57) ABSTRACT

A laser having a first layer of a III-V semiconducting material of a first semiconductor type on which a mask having an opening therein is deposited. A second layer of a III-V semiconducting material of the first semiconductor type is grown from the portion of the first layer underlying the opening in the mask and extends over the mask. A first cladding layer of a III-V semiconducting material of the first semiconductor type is grown over the second layer so as to cover the second layer. The active layer that generates light upon the recombination of holes and electrons therein is grown over the first cladding layer. A second cladding layer of a III-V semiconducting material is grown over the active layer, the second cladding layer including a III-V semiconducting material of the opposite semiconductor type from the first layer. A third layer of a III-V semiconducting material is grown over the second cladding layer. The third layer of a III-V semiconducting material includes a III-V semiconducting material of the opposite semiconductor type, and the third layer of a III-V semiconducting material includes a crystalline layer covering the cladding layer. Two facets of the crystalline layer form the mirrors at opposite ends of an optical cavity that includes the active layer. The preferred III-V semiconducting material is GaN.

4 Claims, 6 Drawing Sheets

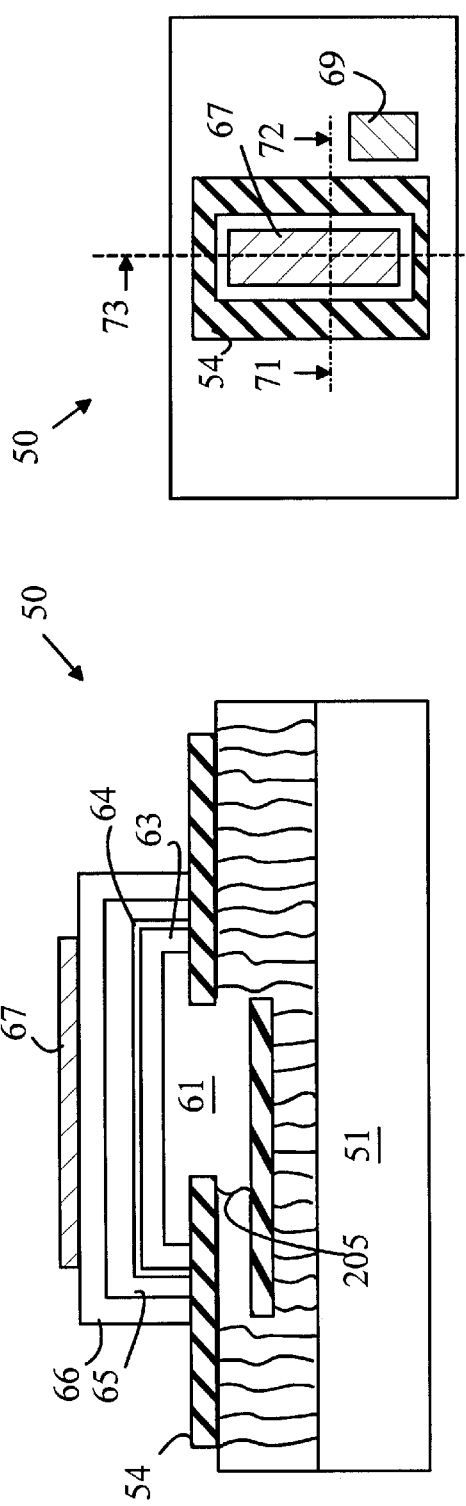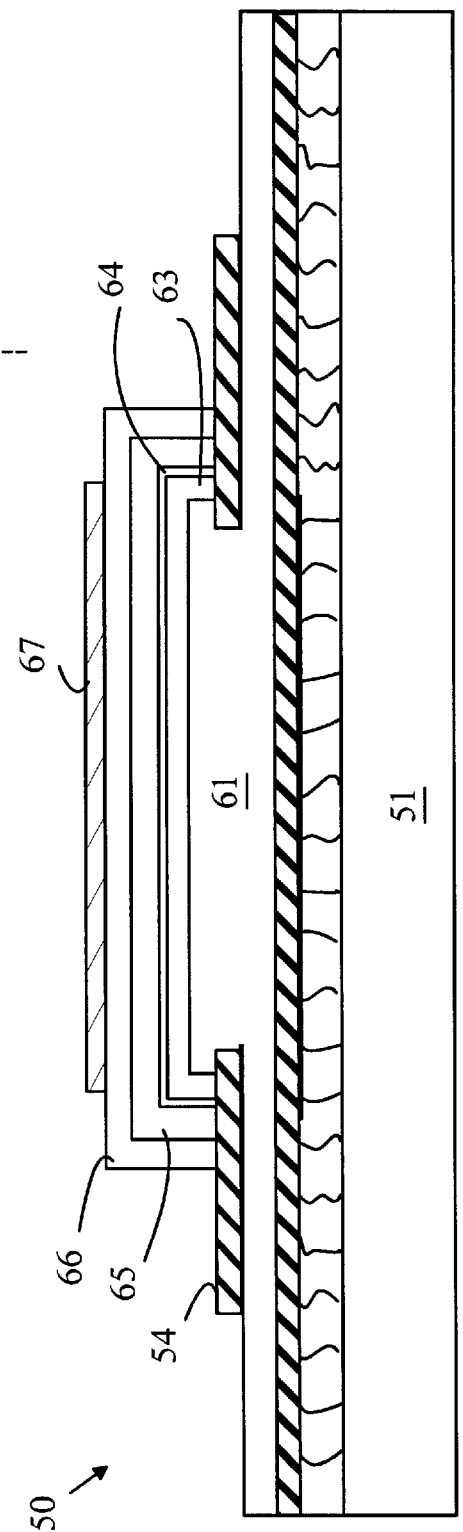

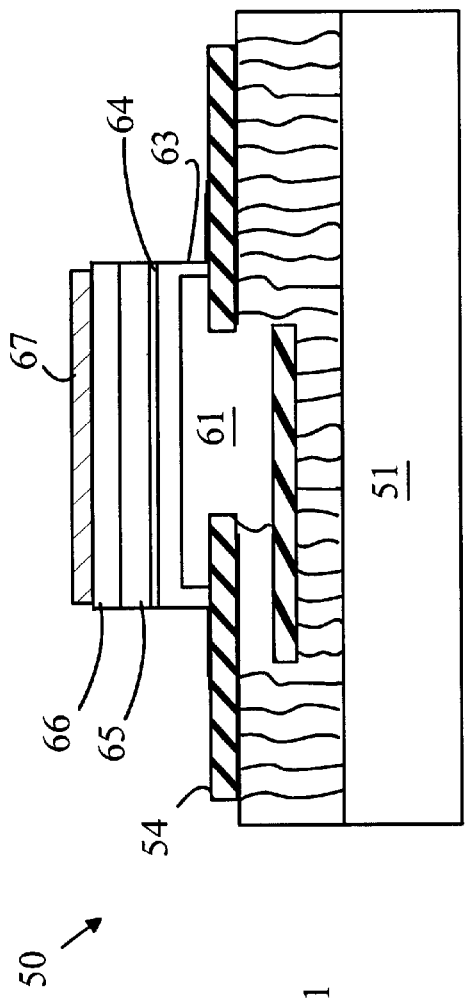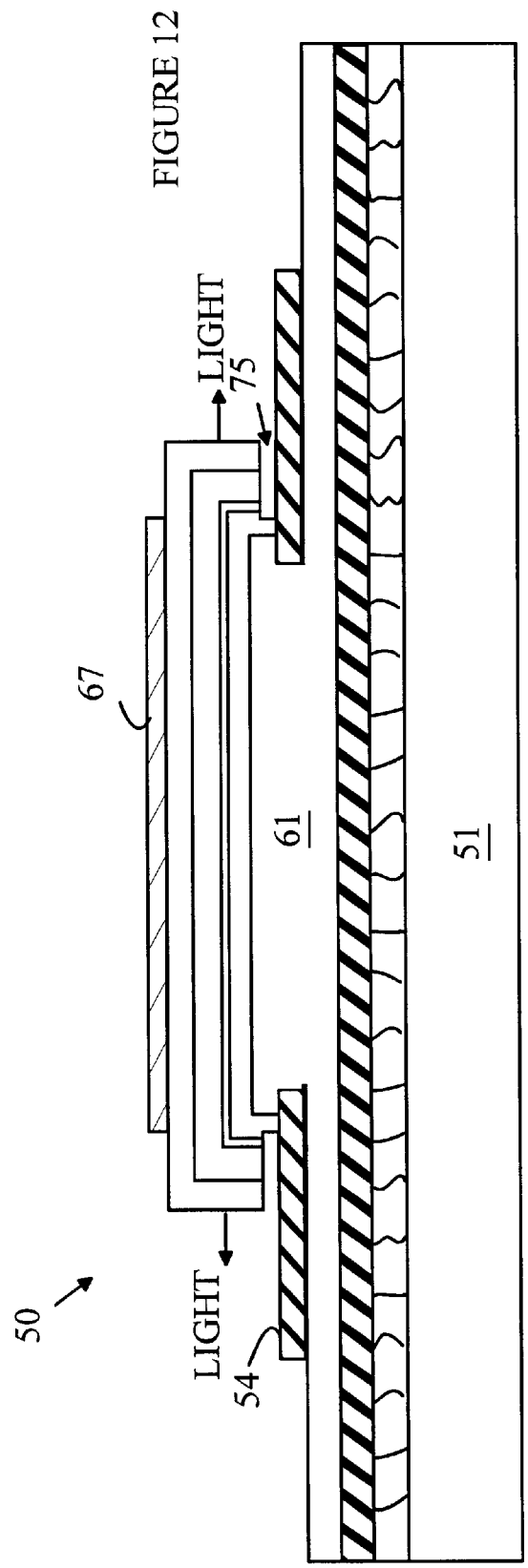

US 6,240,115 B1

EPITAXIAL FACET FORMATION FOR LASER DIODES BASED ON III-V MATERIAL SYSTEMS

FIELD OF THE INVENTION

The present invention relates to semiconductor lasers, and more particularly, to edge emitting lasers based on GaN or other III-V material systems.

Background of the Invention

III-V materials such as GaN are particularly useful in constructing lasers and LEDs in the blue and green wavelengths. These layers are typically deposited on a sapphire substrate. Facets in the GaN layers provide the mirrors for the ends of the laser cavity. These facets must be parallel to one another and have smooth surfaces.

There are two prior art techniques for creating the facets. The first technique involves cleaving the GaN layers and the underlying sapphire substrate. The lattice constants of GaN and sapphire differ by 13%. In addition, the sapphire substrate is very hard. As a result, the cleavage plane is not always precisely perpendicular to the active layer plane of the laser. This leads to facets that are not perfectly parallel to one another. Hence, additional processing is needed in the form of time consuming polishing operations to correct for the cleavage errors. In addition, prior to cleavage, the sapphire substrate must be thinned in the region in which the cleavage is to take place. This thinning operation also increases the cost of the processing.

The second prior art method involves masking the GaN layers and reactive ion etching the stack to form the mirror facets. Unfortunately, the masks often have small imperfections that result in striations on the facet surface. These striations cause the mirrors to be optically lossy.

Broadly, it is the object of the present invention to provide an improved GaN laser.

It is a further object of the present invention to provide a laser that does not require the facets to be generated by cleavage of the underlying substrate and GaN layers.

It is a still further object of the present invention to provide a laser that does not require the mirror facets to be etched or polished.

These and other objects of the present invention will become apparent to those skilled in the art from the following detailed description of the invention and the accompanying drawings.

SUMMARY OF THE INVENTION

The present invention is a laser having a first layer of a III-V semiconducting material of a first semiconductor type on which a mask having an opening therein is deposited. A second layer of a III-V semiconducting material of the first semiconductor type is grown from the portion of the first layer underlying the opening in the mask and extends over the mask. A first cladding layer of a III-V semiconducting material of the first semiconductor type is grown over the second layer so as to cover the second layer. The active layer that generates light upon the recombination of holes and electrons therein is grown over the first cladding layer. A second cladding layer of a III-V semiconducting material is grown over the active layer, the second cladding layer includes a III-V semiconducting material of the opposite semiconductor type from the first layer. A third layer of a III-V semiconducting material is grown over the second cladding layer. The third layer of a III-V semiconducting material includes a III-V semiconducting material of the opposite semiconductor type, and the third layer of a III-V semiconducting material includes a crystalline layer covering the cladding layer. Two facets of the crystalline layer form the mirrors at opposite ends of an optical cavity that includes the active layer. The preferred III-V semiconducting material is GaN. The mask is constructed from a material on which the III-V semiconducting materials will not nucleate.

BRIEF DESCRIPTION OF THE DRAWINGS

FIGS. 6–12 illustrate the steps in the construction of a laser according to the present invention.

DETAILED DESCRIPTION OF THE INVENTION

Figure 1:
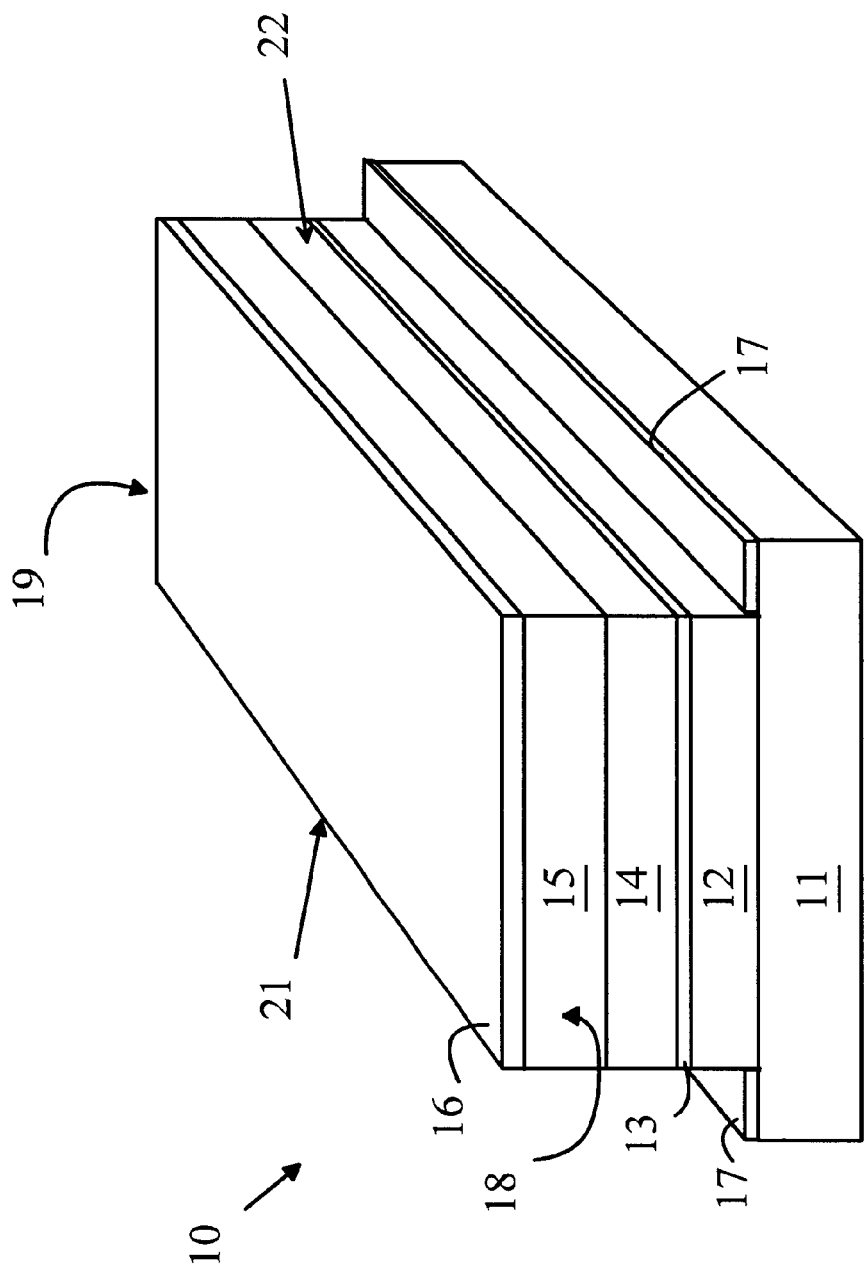
FIG. 1 is a perspective view of a typical GaN-based laser.

The present invention may be more easily understood with reference to FIG. 1, which is a perspective view of a typical GaN-based laser 10. Only the most basic epitaxial layers are shown for sake of simplicity. Laser 10 is constructed from 5 layers of GaN material, an N-type GaN layer 11, an N-type AlGaN cladding layer 12, an active layer 13, a P-type AlGaN cladding layer 14 and a P-type GaN layer 15. It should be noted that each of the cladding layers is often constructed from a plurality of layers of slightly different composition. To simplify the drawings, the cladding layers are each shown as a single layer.

Active layer 13 generates light by the recombination of holes and electrons resulting from a potential being applied between layers 11 and 15. This light is confined to a cavity bounded by cladding layers 12 and 14 and the facets shown at 18 and 19. The facets shown at 21 and 22 are much less critical because these facets are not responsible for reflecting the light back and forth through the active region. Contacts 17 and 16 provide the connection points for applying the potential across the n-p diode structure. Laser 10 is typically constructed by depositing the various layers on a substrate and then creating the various facets.

Facets 18 and 19 must be parallel and smooth to provide a laser with high electrical efficiency. As noted above, difficulty in creating these facets leads to high cost and lower production yield.

In addition, the various GaN layers must be free of defects. Defects typically arise from the mismatch of the lattice constants between GaN and sapphire, the substrate of choice. Techniques for reducing the defect density utilizing growth over a $SiO_2$ pad are known to those skilled in the art.

Figure 2:
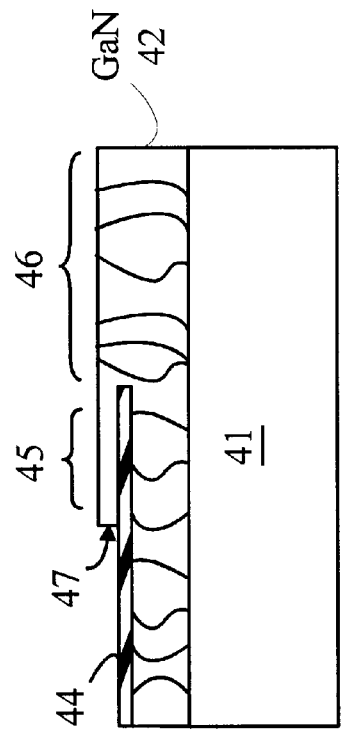
FIGS. 2–4 are cross-sectional views illustrating the growth of GaN on a sapphire substrate.
Figure 3:
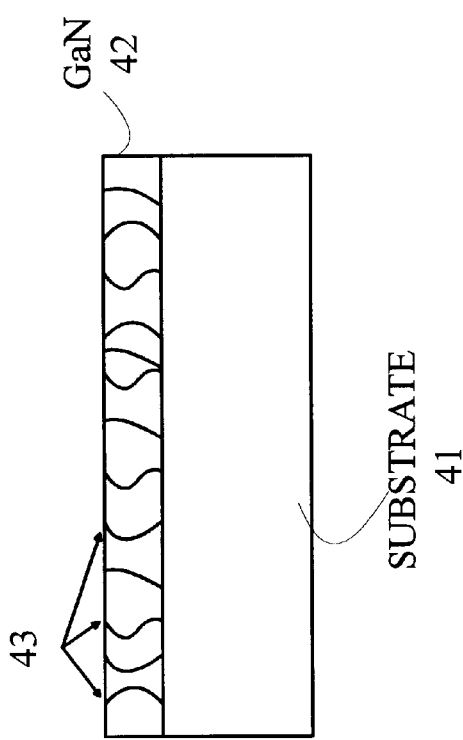
Figure 4:
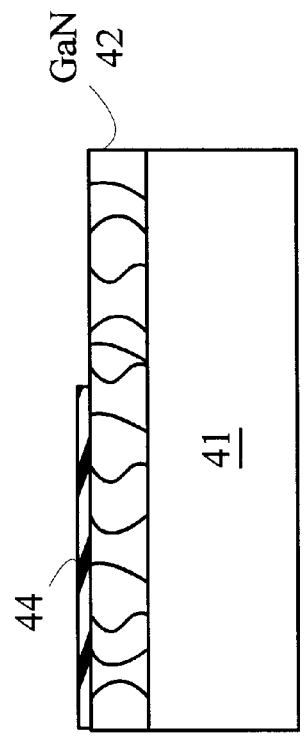

The present invention is based on the observation that low dislocation regions of GaN are observed when a GaN layer is grown over a $SiO_2$ layer by propagating the GaN laterally from a region of GaN adjacent to the $SiO_2$ region. This phenomenon is well known to those skilled in the art, and hence, will not be discussed in detail here. For the purposes of the present discussion, the phenomenon may be more easily understood with reference to FIGS. 2–4 which are cross-sectional views illustrating the growth of GaN on a sapphire substrate 41. Referring to FIG. 2, the process is started by growing a layer of GaN 42 over substrate 41. Layer 42 has a high density of dislocations as shown at 43. A strip of $SiO_2$ 44 is then deposited on the layer of GaN as shown in FIG. 3, and a new layer of GaN is then grown epitaxially over the surface of layer 42 and strip 44 as shown in FIG. 4. The GaN on the side of strip 44 acts as a seed area for the growth of GaN, which proceeds upward, and laterally over strip 44 as shown in FIG. 4.

The dislocations in the areas not covered by strip 44 are propagated through the new growth as shown at 46.

However, it is found experimentally that the area 45 of lateral growth over strip 44 has relatively few dislocations. The dislocation density in area 45 can be several orders of magnitude less than the dislocation density in region 46.

Figure 5:
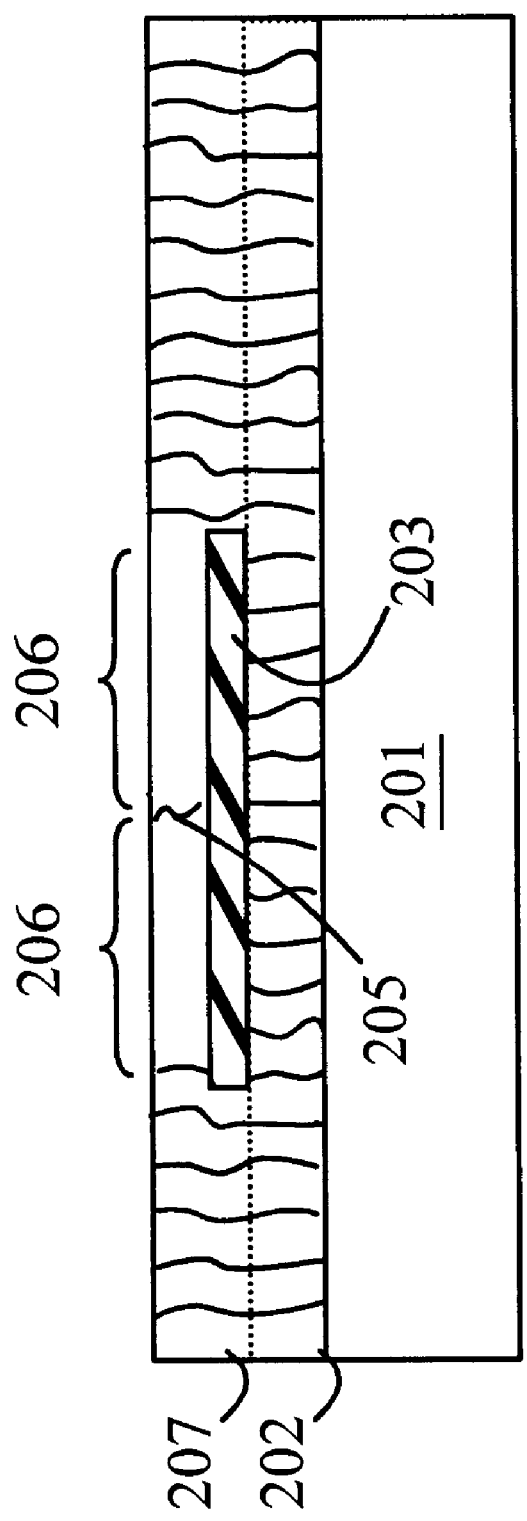
FIG. 5 is a cross-sectional view of a GaN layer grown on a sapphire substrate.

The present invention is based on the observation that, not only is the dislocation density substantially reduced, but also the edge 47 of the GaN that propagates over the SiO$_2$ layer is perfectly vertical, forming a natural facet. The present invention depends on having a starting material that has a substantially defect free region prior to the deposition on the SiO$_2$ mask. The manner in which such a starting material is generated may be more easily understood with reference to FIG. 5 which is a cross-sectional view of a GaN layer grown on a sapphire substrate 201. The GaN layer is started by epitaxially growing a layer of GaN 202 on the sapphire substrate. As noted above, such a layer has a high density of dislocations resulting from the lattice mis-match between GaN and sapphire. For the sake of simplicity, we have shown GaN grown directly on sapphire. In certain cases, AlN or GaN buffer layers are grown prior to bulk GaN growth. The buffer layers are for nucleation purposes.

A layer having fewer dislocations is generated by depositing a SiO$_2$ strip 203 on layer 202 and then epitaxially growing an additional layer 207 of GaN over the strip. As noted above, the GaN that extends over the SiO$_2$ strip is essentially defect free. There is, however, a large defect over the strip at the location at which the GaN growth from each side of the strip meets. Such a defect is shown at 205. However, the regions 206 between this defect and the edge of the SiO$_2$ strip are substantially defect free or significantly lower in defect density.

Figure 7:
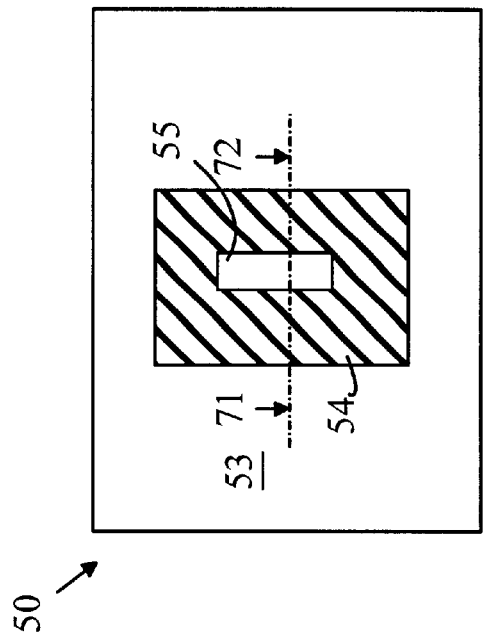
Figure 6:
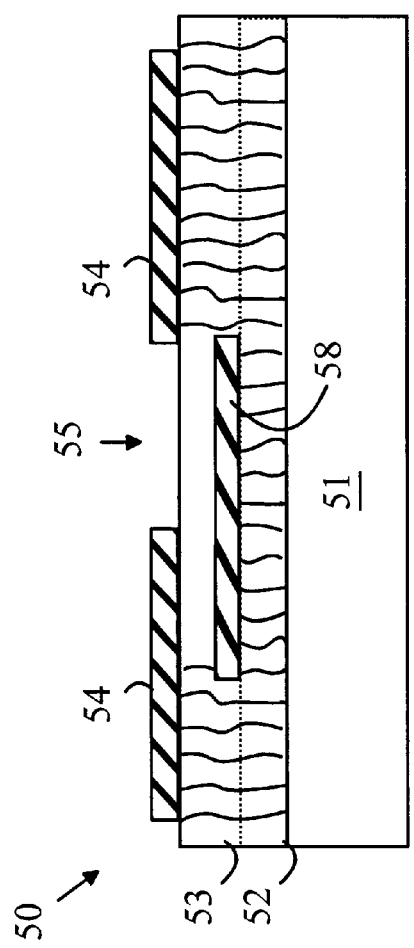

Refer now to FIGS. 6–12, which illustrate the construction of a laser 50 according to the present invention. The fabrication process begins by creating a substantially defect free region of n-GaN on which a SiO$_2$ mask is deposited. As noted above, this can be accomplished by growing an n-GaN layer 52 on a sapphire substrate 51 as shown in FIGS. 6 and 7. FIG. 7 is a top view of laser 50, and FIG. 6 is a cross-sectional view through line 71–72 shown in FIG. 7. A SiO$_2$ pad 58 is then deposited on layer 52 and a second layer 53 of n-GaN grown over the pad by epitaxial growth from the portion of layer 52 to the sides of pad 58. As noted above, a region of substantially defect free GaN forms over pad 58. A SiO$_2$ mask 54 is then deposited on the layer 53 and covers the defect 205 discussed above with reference to FIG. 5. Mask 54 has an opening 55 which overlies the substantially defect-free region of layer 53.

The various layers of laser 50 are now deposited using the defect-free region in opening 55 to seed the layers which are extended over mask 54 as shown in FIGS. 8–10. Once again, FIG. 9 is a top view of the device, FIG. 8 is a cross-sectional view through line 71–72, and FIG. 10 is a cross-sectional view through line 73–74 shown in FIG. 9. The layers in order of growth are the n-GaN layer 61, n-type AlGaN cladding layer 63, active layer 64, a p-type AlGaN cladding layer 65 and a p-type GaN layer 66. The natural facets of p-GaN layer 66 provide the end mirrors for the laser's optical cavity.

The contact 67 to the p-GaN layer shown at 66 is patterned such that the portion of active layer 64 that underlies the contact includes the vertical portions of the active layer. The connections to layer 61 may be made by depositing one or more contacts on the surface of layer 53 as shown at 69. It should be noted that mask 54 will constrain the current flow to the desired portion of the active layer.

Refer now to FIGS. 11 and 12, which are cross-sectional views of laser 50, after two optional etching steps have been performed. FIG. 11 is a view through line 71–72 shown in FIG. 9, and FIG. 12 is a view through line 73–74. In the preferred embodiment of the present invention, the walls of the laser that are perpendicular to the mirror facets are etched to remove any extraneous current paths. Since the reflectivity of these walls does not determine gain of the laser, imperfections in the etched walls do not interfere with the laser's operation.

Refer now to FIG. 12. While the facets of the various layers are known to grow vertically and parallel to one another in the regions over the SiO$_2$ mask in certain crystal plane directions, the details of the growth pattern at the SiO$_2$ GaN interface may be such that the various layers can be electrically shorted or in very close proximity to one another. One method of remedying the situation is by masking the sidewalls and etching a narrow undercut such as shown at 75.

The above-described embodiments of the present invention utilized an n-GaN layer in contact with the sapphire substrate and a p-GaN layer above the active layer. However, it will be obvious to those skilled in the art from the preceding discussion that the p-type and n-type layers can be reversed.

While the above-described embodiments of the present invention have utilized GaN layers, the teachings of the present invention can be applied to a layer constructed from any III-V material, e.g. InP, GaAs, etc. It should also be noted that the various layers of the laser may be constructed from different III-V semiconducting materials or combinations of layers of different III-V semiconducting materials.

Similarly, other mask materials may be utilized. Any material that is compatible with the processing conditions and which has the property that the III-V material cannot nucleate thereon may be utilized. In the preferred embodiment of the present invention, the mask material is a dielectric such as SiO$_2$, SiC, Si$_3$N$_4$, TiN AlN, etc. However, masks based on conductors such as carbonized polymers can also be utilized provided any layers that would be shorted by the mask are separated from the mask after the layers have been deposited.

Various modifications to the present invention will become apparent to those skilled in the art from the foregoing description and accompanying drawings. Accordingly, the present invention is to be limited solely by the scope of the following claims.

What is claimed is:

1. A laser comprising:
    a first layer of a III-V semiconductor material of a first conductivity type;
    a mask having an opening therein in contact with said first layer, said mask comprising a material on which said III-V semiconductor material does not nucleate;
    a second layer of a III-V semiconductor material of said first conductivity type, said second layer being grown from said portion of said first layer underlying said opening in said mask and extending over said mask;
    a first cladding layer of a III-V semiconductor material of said first conductivity type, said first cladding layer overlying said second layer;
    an active layer for generating light upon the recombination of holes and electrons therein, said active layer overlying said first cladding layer;
    a second cladding layer of a III-V semiconductor material, said second cladding layer comprising a III-V semiconductor material of the opposite conductivity type from said first layer and said second cladding layer overlying said active layer; and
    a third layer of a III-V semiconductor material, said third layer of III-V semiconductor material comprising a III-V semiconductor material of said opposite conductivity type and said third layer of III-V semiconductor material comprising a crystalline layer overlying said second cladding layer, two facets of said crystalline layer forming mirrors at opposite ends of an optical cavity comprising said active layer.

2. The laser of claim 1 wherein said III-V semiconductor material in one of said layers comprises GaN.

3. The laser of claim 1 further comprising an island of a material on which said first layer of semiconductor material does not nucleate, said island being buried under said first layer and underlying said opening in said mask.

4. The laser of claim 1 wherein said mask comprises $SiO_2$, $Si_3N_4$, TiN, or AlN.

* * * * *